(12) United States Patent
Koga et al.

(10) Patent No.: US 6,957,378 B2
(45) Date of Patent: Oct. 18, 2005

(54) SEMICONDUCTOR MEMORY DEVICE

(75) Inventors: Mitsuhiro Koga, Yokohama (JP);
Munehiro Yoshida, Austin, TX (US);
Hiroshi Shinya, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 395 days.

(21) Appl. No.: 10/162,414

(22) Filed: Jun. 3, 2002

(65) Prior Publication Data
US 2002/0184592 A1 Dec. 5, 2002

(30) Foreign Application Priority Data
Jun. 4, 2001 (JP) .............................. 2001-168706

(51) Int. Cl.$^7$ .............................................. G11C 29/00
(52) U.S. Cl. ...................... 714/763; 714/767; 714/785; 714/777
(58) Field of Search ............................ 714/805, 754, 714/758, 763, 764, 767, 768, 769, 770, 777, 714/785, 800

(56) References Cited

U.S. PATENT DOCUMENTS

| | | | |
|---|---|---|---|
| 5,383,205 A | * | 1/1995 | Makihara et al. ........... 714/773 |
| 5,384,789 A | * | 1/1995 | Tomita ........................ 714/755 |
| 5,604,703 A | * | 2/1997 | Nagashima .................. 365/200 |
| 5,914,907 A | * | 6/1999 | Kobayashi et al. ..... 365/230.03 |
| 5,933,436 A | * | 8/1999 | Tanzawa et al. ............ 714/762 |
| 6,233,717 B1 | * | 5/2001 | Choi ........................... 714/805 |
| 6,510,537 B1 | * | 1/2003 | Lee ............................. 714/763 |

* cited by examiner

*Primary Examiner*—Guy Lamarre
*Assistant Examiner*—Fritz Alphonse
(74) *Attorney, Agent, or Firm*—Hogan & Hartson, LLP

(57) ABSTRACT

A semiconductor memory device is disclosed which comprises a cell array including a normal data section used for normal data write and read and a parity data section used for check data write and read, the check data being for execution of error check of data as read out of the normal data section, a data buffer for temporal stage of read data from the cell array and write data into the cell array, and an ECC circuit for generating the check data to be stored in the parity data section from write data as input during data writing, and for performing error check and correction of data read out of the normal section based on the data read out of the normal data section and the check data read out of said parity data section during data reading. N-bit parallel data transfer is performed between the data buffer and normal data section whereas m-bit parallel data transfer is done between the data buffer and external input/output terminals (where m and n are integers satisfying m<n).

30 Claims, 9 Drawing Sheets

SEMICONDUCTOR MEMORY DEVICE

CROSS-REFERENCE TO RELATED APPLICATION

This application is based on and claims the benefit of priority from prior Japanese Patent Application No. 2001-168706, filed on Jun. 4, 2001, the entire content of which is incorporated herein by reference.

BACKGROUND OF THE INVENTION

1. Field of the Invention

This invention relates generally to semiconductor memory devices and more particularly to a semiconductor memory device capable of recovering or "rescuing" data defects occurring due to the quest for lower electrical power consumption.

2. Description of the Related Art

As semiconductor memory devices decrease in size and power dissipation while increasing in storage capacity, it is becoming more difficult for memory cells of such semiconductor memories, in particular those having ultrafine or "micro" structures, to attain high reliability in view of fabrication process technologies and also transistor characteristics. Semiconductor memories include static random access memory (SRAM) chips with an array of memory cells, each of which is formed of a plurality of transistors—in traditional SRAM cells of the full complementary metal oxide semiconductor (CMOS) type, six separate transistors are used on a per-cell basis. Due to the use of multiple transistors per cell, SRAMS suffer from difficulties in achievement of small size and large storage capacity. In contrast thereto, dynamic random access memory (DRAM) chips are such that a memory cell consists essentially of a single transistor and one capacitor, which enables DRAMs to be better suited for achievement of small sizes and large storage capacities.

In light of these characteristics of SRAMs and DRAMs, in small size portable or handheld electronic equipment such as for example mobile wireless telephone handsets, personal digital assistants (PDAs), note pads, palm-top personal computers (PCs) or the like, it has been considered to achieve smaller size (higher density) by replacing part of prior known memory systems using SRAMs with a new type of memory chips using DRAM-based cells with SRAM interface architectures, also known as Pseudo SRAMs or "PSRAMs." Generally, DRAMs are designed to perform multiplex row and column addresses; on the contrary, SRAMs perform no such address multiplexing. Accordingly, direct use of SRAM interface would result in PSRAMs being used with the lack of any address multiplexing. In addition, DRAMs call for execution of data refresh operations; thus, it becomes necessary for PSRAMs also to contain internal automatic refresh circuitry as built therein.

It is apparent from the foregoing discussion that the use of PSRAMs enables achievement of smaller system sizes and thus larger storage capacities (higher integration densities), although this approach accompanies a penalty that PSRAMs become greater in data retain currents than SRAMs due to employment of DRAM-based cell designs. Unfortunately, in cases where an attempt is made to achieve further reduced power consumption, the resultant memory cells decrease in data retaining characteristics. The degradation of data storing performance causes a problem as to unwanted generation of defective data even when PSRAMs are designed to come with on-chip automatic refresh circuitry.

The data storability degradation due to employment of advanced power save technologies is not a problem unique to PSRAMs per se. It can cause problems in standard DRAMs and also in electrically erasable and programmable read-only memory (EEPROM) chips.

SUMMARY OF THE INVENTION

In accordance with one aspect of this invention, a semiconductor memory device comprises a cell array including a normal data section used for normal data write and read and a parity data section for storing therein test data for execution of error detection of data as read out of the normal data section, a data buffer for temporal stage of read data from said cell array and write data into the cell array, and error checking and correction circuitry for generating test data to be stored in said parity data section from write data as input thereto during data writing and for performing error detection and correction of data being read based on the data read out of said normal data section and the test data as read out of said parity data section during data reading, wherein n-bit parallel data transfer is performed between said data buffer and the normal data unit of said cell array whereas m-bit parallel data transfer is done between said data buffer and an external input/output terminal (where m<n), wherein n-bit data including m-bit data to be rewritten is read in parallel within a first half period of a data write cycle while letting error detection and correction of the n-bit data be done at said error checking and correction circuitry, and wherein a to-be-written m-bit data portion of the n-bit parallel data as has been corrected at said error checking and correction circuitry is replaced with m-bit parallel data as supplied from the external input/output terminal in a second half period of the data write cycle and then sent forth to said normal data section.

These and other features, objects and advantages of the invention will be apparent from the following more particular description of preferred embodiments of the invention, as illustrated in the accompanying drawings.

DETAILED DESCRIPTION OF THE EMBODIMENTS

Figure 1:
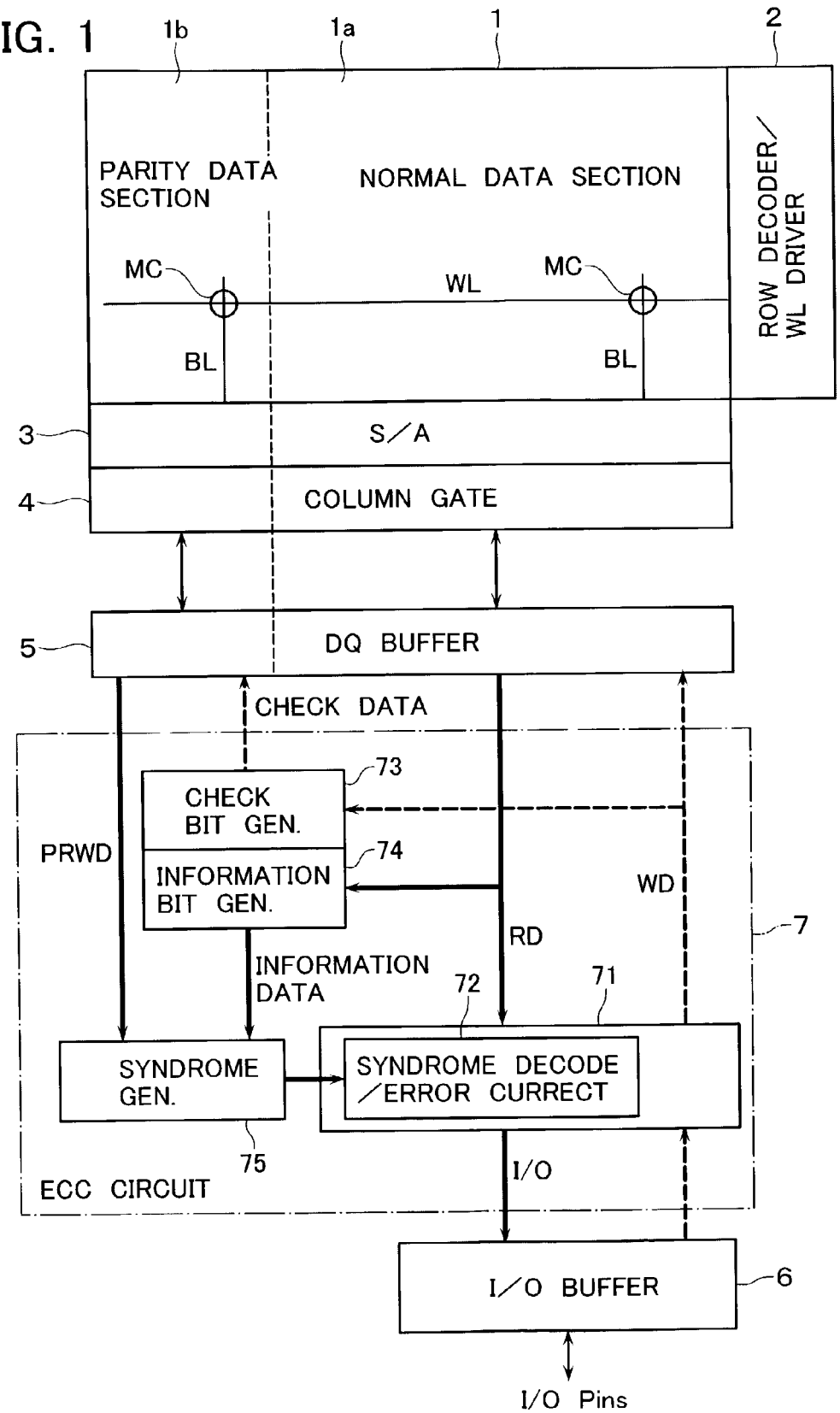
FIG. 1 is a diagram showing a configuration of a semiconductor memory device in accordance with an embodiment of this invention.

Several embodiments of this invention will be described with reference to the drawings. Like parts and parts performing similar functions are designated by like reference characters.

Referring to FIG. 1, there is shown a configuration of core part of a semiconductor memory device embodying this invention. This semiconductor memory is a pseudo SRAM (PSRAM) which integrate therein DRAM-based cells with an SRAM interface and achieves higher density, high-speed performance and low power consumption. In this embodiment, in order to recover or "rescue" any possible data defects in a DRAM-based memory cell array 1, an error checking and correcting (ECC) circuit 7 is interposed between the cell array 1 and an input/output (I/O) buffer 6 for performing error checking of read data and for performing error correction. The ECC circuit 7 is the one that performs one bit error check and correction by use of a Hamming code.

The DRAM cell array 1 is divided into two areas; a normal data section 1a and a parity data section 1b. The normal data section 1a is for performing ordinary or normal data storage. The parity data section 1b stores therein check-use data (parity data) used for error checking and correction. The cell array 1 comes with a plurality of parallel word lines WL and parallel bit lines BL that cross over the word lines WL. The wordlines WL are associated with a row decoder/word-line driver circuit 2 connected thereto, which is operable to selectively drive wordlines WL. Each wordline WL is designed to continuously extend from the normal data section 1a up to the parity data section 1b. DRAM cells MC are provided at cross points or "intersections" of the wordlines WL and bitlines BL.

The bitlines BL of the cell array 1 are connected to a sense amplifier circuit 3. A bitline BL is selected by a column gate 4 for permitting data transmission between it and a data line DQ. The data line DQ is provided with a DQ buffer 5. The ECC circuit 7 is disposed between this DQ buffer 5 and I/O buffer 6.

The ECC circuit 7 has a read/write driver 71 for interexchanging or "routing" read/write data between the DQ buffer 5 and I/O buffer 6. ECC circuit 7 also has a check bit generation circuit 73 that generates, based on write data WD being supplied from I/O terminals or "pins", check data to be written into the parity data section 1b. In the case of a single-bit error correction, the check bit generator circuit 73 is operable to generate M bits of check data to thereby ensure that a correctable code word (Hamming code) with a code length of N+M bits is created from N data bits. Illustratively, the check data is generated in such a way as to satisfy $HV^T=0$, where V is a Hamming code word vector, and H is a check matrix, which may be an array of M digits of binary numbers.

ECC circuit 7 further includes a syndrome generation circuit 75 that generates syndrome signals based on check data PRWD being read out of the parity data section 1b and data RD as read from the normal data section 1a. An information bit generation circuit 74 is formed of an array of Exclusive-OR (Ex-OR) gates to generate M information bits for syndrome generation based on the read data RD and the predetermined check matrix data, which will then be sent to the syndrome generator circuit 75. Syndrome generator 75 is made up of an array of EX-OR gates to generate an M-bit syndrome signal by input of the check data PRWD (M-bit) and the information bits (M-bit) as generated at the information bit generator circuit 74.

The read/write driver 71 includes a built-in syndrome decode/error correction circuit 72. This circuit 72 decodes the syndrome signals generated at the syndrome generator circuit 75 to perform an error checking/correcting operation and then execute correction of an error bit if any. A syndrome decode circuit is formed of a NAND/NOR gate array or alternatively a NAND gate array for detection of a column that corresponds to the error bit being presently found in the check matrix with a syndrome signal $S(=HV^T)$ being not equal to "0".

In FIG. 1, the read data RD and write data WD are shown as if they are transferred on different data lines. In actual fact, the read data RD and write data WD are on an identical data bus in different timings from each other. I/O data bus between the read/write driver 71 and the I/O buffer 6 is the same as above-described. This situation is the same in other embodiments as described after.

An operation of the semiconductor memory chip thus arranged is as follows. During data reading, the ECC circuit 7 compares data RD being read out of the normal data section 1a to check data PRWD as read from the parity data section 1b at the syndrome generator circuit 75 to thereby generate a syndrome signal. This syndrome signal is decoded to output "0" at error-free addresses of the Hamming-code check matrix, whereas output "1" at an address at which an error occurs. The read/write driver 71 is such that its syndrome decode/correction circuit 72 decodes the syndrome signal to perform error detection and inverts bit data at the error-detected address for external output of corrected data.

During data writing, externally supplied write data WD is used to generate test-use data within the ECC circuit 7. And, the write data WD is written into the normal data section 1a while substantially simultaneously letting the check data thus generated be written into the parity data section 1b.

In this way, the use of the on-chip ECC circuit makes it possible to read right data that has been corrected based on the check data even in cases where the memory cell array 1 is slightly degraded in data retain characteristics due to employment of electrical power save architectures. Although not specifically depicted in the drawing, combined use with redundancy circuit schemes for replacement of defective cells may enable achievement of higher recovery or "rescue" efficiencies in case the cell array 1 contains various kinds of cell defects. While the redundancy circuit schemes per se are incapable of handling cell defects occurring after chip packaging, the ECC circuit may accommodate this kind of cell defects also.

It should be noted that the ECC circuit 7 is inherently provided for external output of correct data even in the presence of a cell data error(s) during data reading; in this respect, ECC circuit 7 does not perform correction of cell data corresponding to such error(s) during reading. The same goes with any one of embodiments as will be discussed later in the description.

Also note that in the case of single bit error correction by use of a Hamming code, the ECC circuit 7 is also capable of detecting an error bit of the check data read out the parity data section 1b. Note however that the presence of an error bit in the check data means that data of the normal data section 1a is correct. Thus, no need is felt to perform data correction of parity data section 1b.

Figure 2:
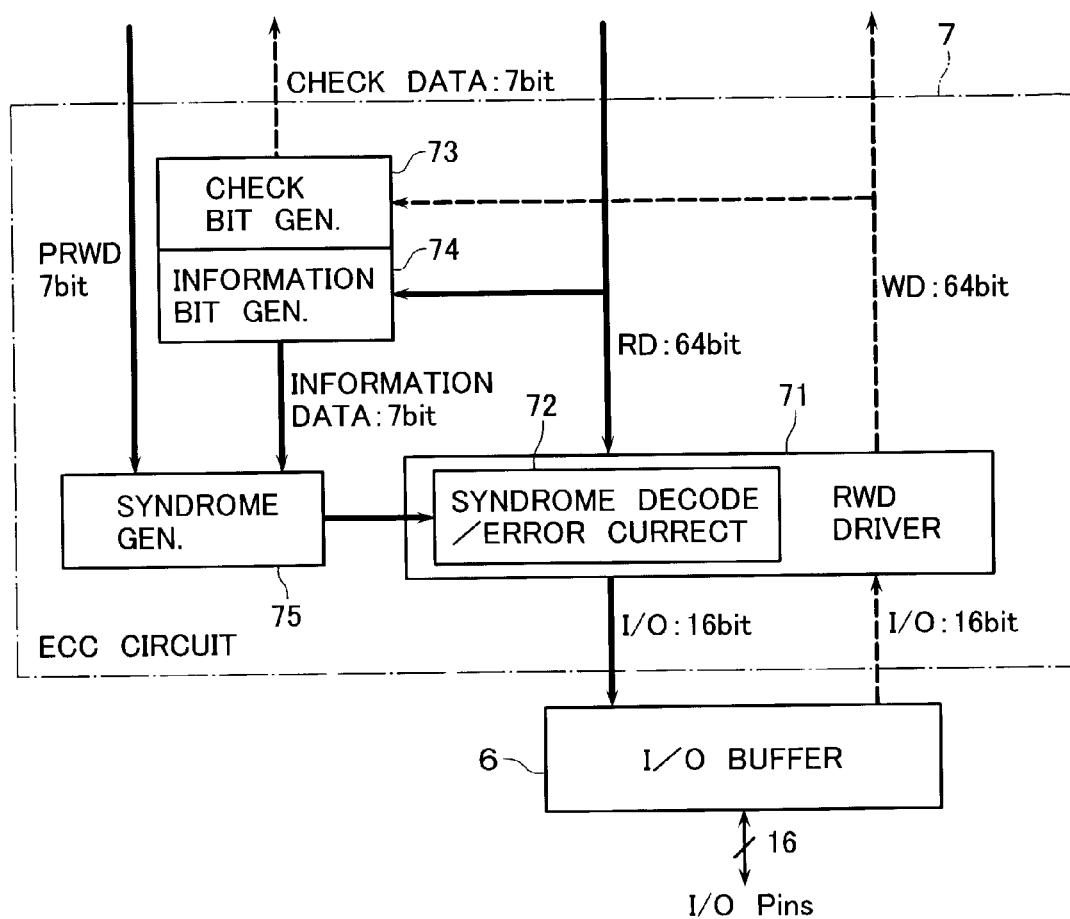
FIG. 2 is a diagram showing a configuration of an error checking and correcting (ECC) circuit as used in a semiconductor memory in accordance with another embodiment of the invention.

Turning to FIG. 2, there is illustrated a detailed internal configuration of the ECC circuit 7 of FIG. 1. Here, a discussion is made under an assumption that n-bit parallel data transmission is performed between the data buffer 5 and the cell array 1 whereas m-bit parallel data transfer is done between data buffer 5 and I/O terminals or pins. Note that "m" and "n" are positive integers (preferably, power multipliers of 2), where m<n. In the illustrative circuitry of FIG. 2, m=16 and n=64, by way of example.

Parallel read/write data of the normal data section 1a in the cell array 1 is data of n=64 bits. Suppose that the ECC circuit 7 performs 1-bit error correction using Hamming code. Generally, the number k of check bits required for execution of such 1-bit error correction with respect to n-bit data is represented by $2^k$ n+k+1. The minimum check bit number k required for 1-bit error correction of data of n=64 bits is given as k=7. Accordingly the parity data section 1b is accessed simultaneously during access of a region of 64-bit parallel data, resulting in 7-bit check data being subject to read/write processing.

During data reading, the ECC circuit 7 operates to read 64-bit data of the normal data section 1a and simultaneously read 7 bits of check data. Based on these data items, syndrome processing is executed at the syndrome generator circuit 75, whereby a 7-bit syndrome signal is generated. This syndrome signal is transferred to the read/write driver 71 and decoded thereby. Thus, 1-bit error is detected for correction.

A requisite number of the I/O terminals is m=16. More specifically, while the ECC circuit 7 performs transfer/receipt of 64-bit parallel data between it and the cell array 1 through the data buffer 5, 16-bit parallel data is sent and received between ECC circuit 7 and I/O buffer (thus, I/O terminals). This assumes effectuation of a page mode. With such an arrangement, it is possible to externally read 64-bit data as read into ECC circuit 7 in a serial fashion in units of 16-bit data packets.

In this embodiment, a data write cycle is subdivided into two portions: a first half period, and a second half period. In the first half period, prior to the data write operation from external terminals in units of 16-bit data packets, data read of 64-bit data containing therein the normal data section 1a's 16-bit data to be rewritten is done. ECC circuit 7 performs error checking and correction with respect to this read data. And, in the second half period of write cycle, a 16-bit portion of the 64-bit read data that has experienced the error correction within ECC circuit 7 is replaced by externally supplied 16-bit write data within the read/write driver 71. The resultant partially overwritten 64-bit data is transferred to the normal data section 1a and then written thereinto. Simultaneously check data is generated based on the partially overwritten 64-bit write data and is then written into the parity data section 1b.

In this way, in the case that a 16-bit portion of the 64-bit parallel read data is partially overwritten with external data, it is no longer required to perform error correction relative to the part being overwritten. Accordingly, upon detection of an error bit location of the 64-bit data, an attempt is made to determine whether this location falls within a range of write data addresses: if the error bit location is within the write data addresses, then no error correction is done. This address determination or "judgment" is available because of the fact that the write addresses are ordinarily held within a chip during a write cycle. Only when the error bit is not the same in address as the 16-bit data being externally supplied, such error bit portion is corrected at the correction circuit 72 while letting the remaining portions be rewritten with external data; thereafter, 64-bit data is written into the normal data section 1a in a parallel fashion.

The major functionality of the ECC circuit 7 is to execute its error detection/correction even when an error is found in the read data to thereby output corrected data as right data toward the outside. When new data is written, check data is generated at ECC circuit 7 based on such write data, permitting rewrite of the parity data section 1b. Consequently, no need is felt to perform error detection/correction processing in write cycles if the data transfer/receipt between normal data section 1a and read/write driver 71 is the same in bit number as data transfer/receipt between read/write driver 71 and external terminals. This can be said because even when an error bit is found in the data being retained at a target data-write address of the normal data section 1a, the data portion containing such error is overwritten by write data to provide right or correct data while permitting updating of the check data of parity data section 1b also.

Unfortunately this approach is encountered with a problem in case the memory chip comes with its built-in page mode or the like for performing data transfer/receipt relative to external terminals in units of 16-bit data packets while offering 64-bit parallel data accessibility within the chip per se. In such an operation mode, a remainder of the 64-bit data excluding the 16-bit part to be rewritten—namely, 48-bit data portion—is generally rewritten with no changes applied to the "rare" data as read within the chip. The rare read data rewrite can result in erroneous bit data being rewritten without experiencing any appropriate correction. Fortunately this problem is avoided by the above-described embodiment. Any possible incorrect data rewriting with the failure of adequate correction is avoidable by performance of read data error detection/correction procedure within the first half period of a write cycle in the way stated supra. In case ECC circuit 7 has an ability to correct 1-bit error, doing such data write makes it possible to increase the reliability of ECC circuit functionalities.

Figure 3:
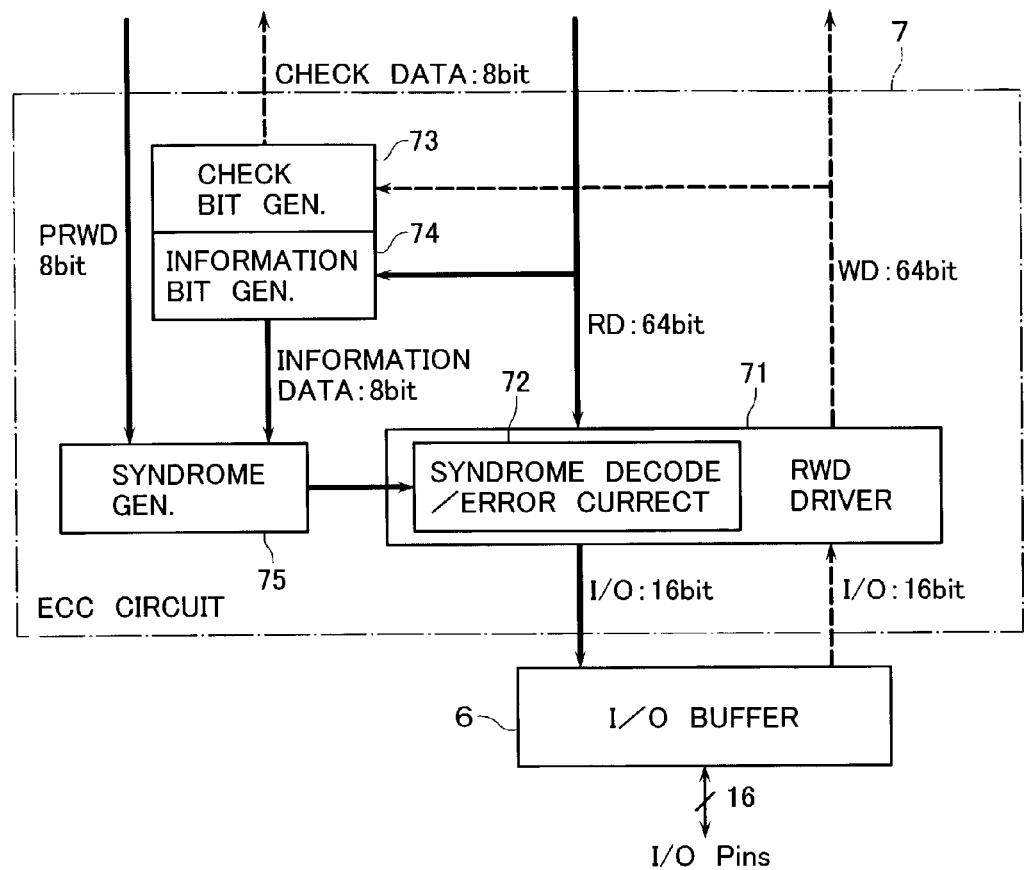
FIG. 3 is a diagram showing a configuration of an ECC circuit in a semiconductor memory in accordance with still another embodiment of the invention.

Referring next to FIG. 3, there is shown another exemplary configuration of the ECC circuit 7 of FIG. 1. Parallel read/write data of the normal data section 1a in the cell array 1 is data of n=64 bits, whereas parallel read/write data of the parity data section 1b is data of m=8 bits, which is greater by 1 bit than that shown in FIG. 2. The ECC circuit 7 offers single-bit error correction using a Hamming code.

An operation of the ECC circuit 7 of FIG. 3 is as follows. During data reading, ECC circuit 7 reads 64-bit data out of the normal data section 1a and simultaneously reads 8-bit check data from the parity data section 1b. Based on these data, syndrome processing is done at a syndrome generator circuit 75 to thereby generate a 8-bit syndrome signal. This syndrome signal is sent forth to a read/write driver 71 and then decoded thereby. Thus a 1-bit error is detected for correction, if any.

In this embodiment also, a data write cycle is divided into two, first and second half periods as in the embodiment of FIG. 2. In the first half period, prior to the data write operation from external terminals in units of 16-bit data packets, data read of 64-bit data containing therein the normal data section 1a's 16-bit data to be rewritten is done. ECC circuit 7 performs error checking and correction with respect to this read data. And, in the second half period of write cycle, a 16-bit portion of the 64-bit read data that has experienced the error correction within ECC circuit 7 is replaced by externally supplied 16-bit write data within the read/write driver 71. The resultant partially overwritten 64-bit data is transferred to the normal data section 1a and then written thereinto. Simultaneously check data is generated based on the partially overwritten 64-bit write data and is then written into the parity data section 1b.

With such an arrangement, similar effects and advantages are obtainable to those of the embodiment of FIG. 2. Another advantage unique to this embodiment is that letting the check data be of 8 bits permits the syndrome decode circuit that decodes a syndrome signal for detection of a correction address(es) of a check matrix to increase in variation of circuit configuration—that is, offer a wide variety of selections as to circuit designs. A detailed explanation of this embodiment will be given in comparison with the embodiment of FIG. 2. As in the FIG. 2 embodiment, suppose that in the case of 7 bits of check data, a bit combination with its 3 bits of "1" and 4 bits of "0" is used for each 7-bit column making up a Humming-code check matrix. In this case, the bit train is such that there are thirty five (35) different patterns in maximum. Regarding a combination with its 4 bits of "1" and 3 bits of "0," this also comes with 35 different combination patterns in maximum. Thus, mere use of 7-bit check data hardly enables accomplishment of any successful check matrix with all of 64 data bits becoming linearly independent.

In contrast, when the check data is designed to be 8 bits as in the embodiment of FIG. 3, seventy (70) different combination patterns are available in maximum for a bit train with its 4 bits of "1" and 4 bits of "0." Due to this, a check matrix with all 64 bits being linearly independent is obtainable. Also note that in this case, the syndrome decode circuit is configurable from a gate array capable of detecting data patterns with 4 bits of "1"s or "0"s. This is also advantageous to pattern layout designs.

Figure 7:
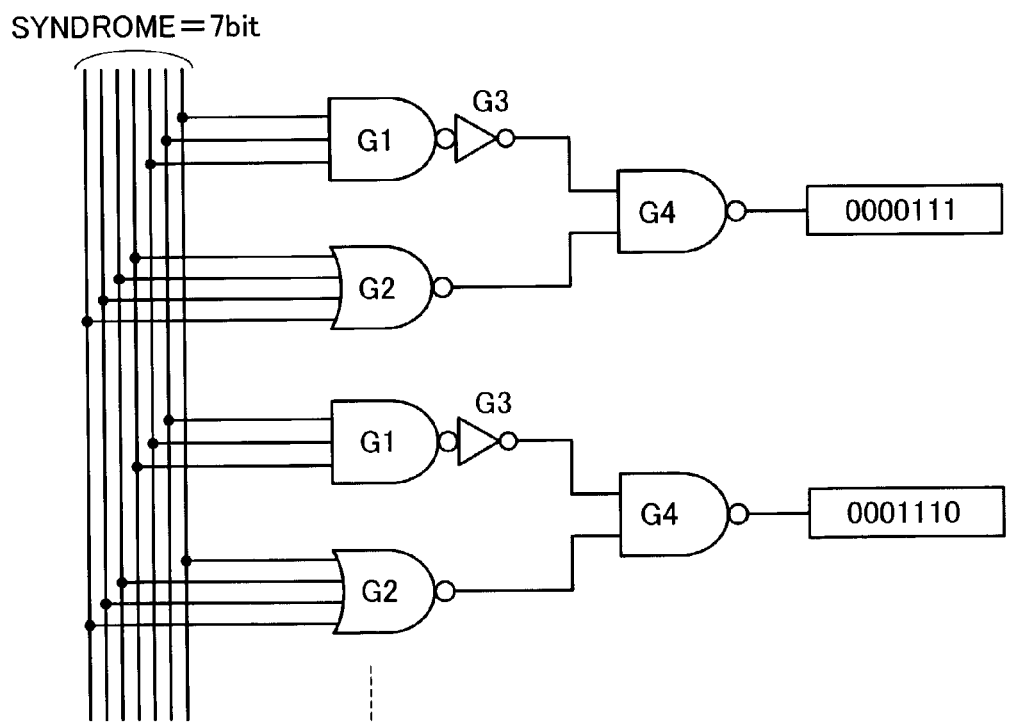
FIG. 7 is a diagram showing a configuration of a syndrome signal decode circuit.

In case 7-bit check data is used as in the FIG. 2 embodiment, the Hamming-code check matrix and code are given as 7-digit binary numbers other than zero (0). At this time, while the syndrome signal is for obtaining a 1-bit error address of the check matrix, the syndrome decode circuit is preferably arranged to have a NOR/NAND configuration as shown in FIG. 7. This circuit configuration is preferable in view of the fact which follows: upon occurrence of errors of more than 2 bits, a 7-bit syndrome with all bits of "1"s can sometimes be generated; at this time, the use of circuitry for detecting and decoding only "1"s or "0"s of the syndrome would result in a plurality of inherently right data items being rewritten unintentionally.

More specifically the syndrome decoder is arranged including a parallel combination of a 3-input NAND gate G1 for detecting that all of the "1" data bits of a 7-digit syndrome signal are "1" and a 4-input NOR gate G2 for detecting that its "0" valued bits are all "0." These logic gates G1, G2 are operatively associated with an inverter gate G3 that inverts an output of the NAND gate G1 and a NAND gate G4 for detecting that both outputs of it and NOR gate G2 are "1." Practically this is the one that handles specific data bits formed of a combination of three "1" valued bits and four "0" bits. As previously stated, in case the check data is of 7 bits, it is impossible to obtain a check matrix with all 64 bits being linearly independent. In order to arrange a decoder with 64-bit decoding abilities, a need is felt to modify based on its combination the requisite input number of the NAND gate G1 and NOR gate G2. Whereby, when no errors are present in read data, the resulting decode data is such that its every bit is set at "0"; if an error is found therein then an output of a corresponding address of the check matrix becomes "1."

Figure 9:
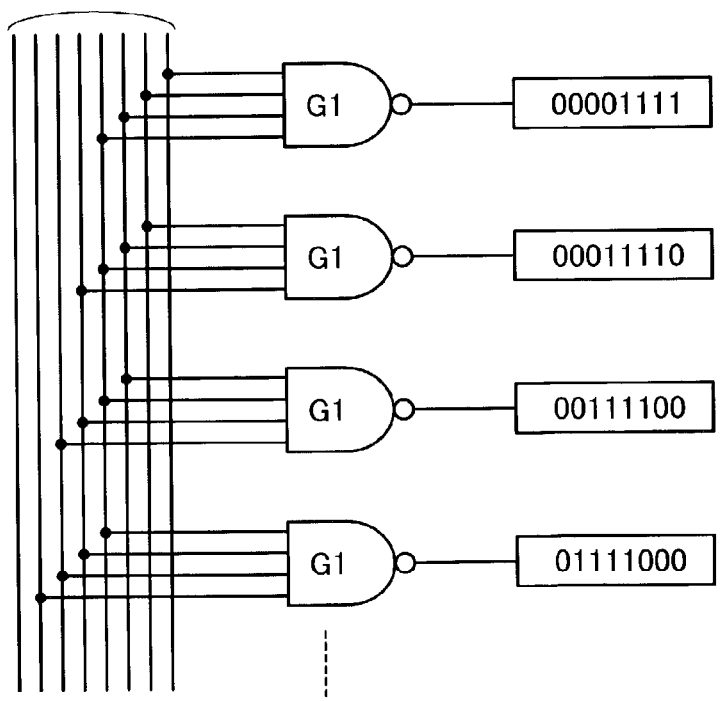

In case 8-bit check data is used as in the FIG. 3 embodiment also, a NOR/NAND-based syndrome decode circuit is employable in a similar way to that in FIG. 7. On the other hand, when the check data is of 8 bits and thus the syndrome signal is of 8 bits, it is possible to design the syndrome decode circuit operatively responsive to receipt of 4-bit input only. More specifically as shown in FIG. 9, the decode circuit is configurable by use of only 4-input NAND gates for performing detection of 4-bit "1" data coincidence or matching. This is because in the case of such 8-bit check data, any intended syndrome with its data bit number set at 64 bits may be generated using a combination of four "1"-valued bits and four "0" bits, which in turn enables detection of error addresses only through matching detection of four "1" data bits.

Figure 4:
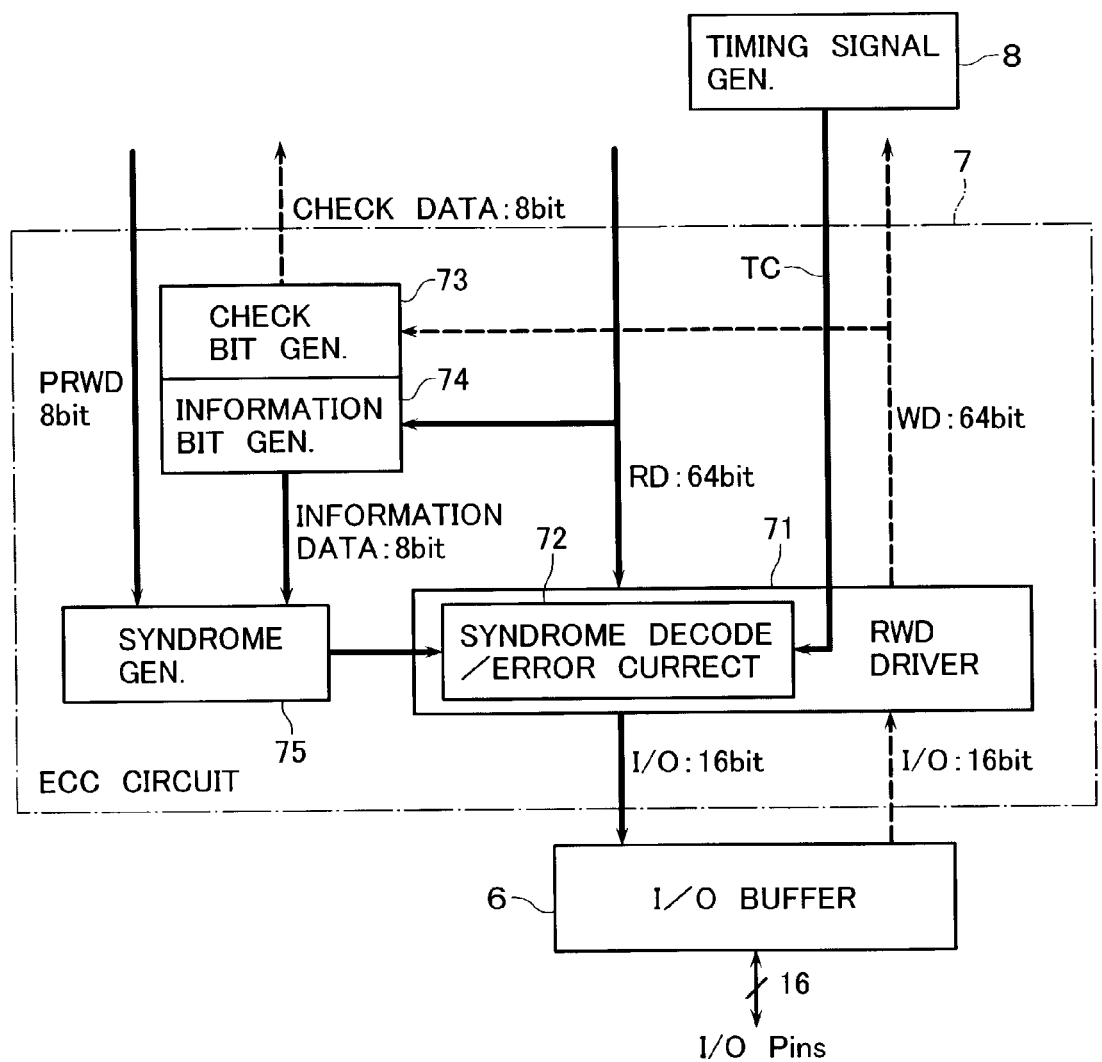
FIG. 4 is a diagram showing a configuration of an ECC circuit in a semiconductor memory in accordance with yet another embodiment of the invention.

Turning to FIG. 4, there is shown a modified version of ECC circuit 7 of FIG. 3. This circuit is similar in fundamental configuration and operation to that shown in FIG. 3, with the syndrome decode/error correction circuit 72 in read/write driver 71 being altered to be associated with a timing adjustment signal generation circuit 8 as newly added thereto. The timing adjustment signal generator circuit 8 is operable to internally generate a timing signal TC for setting of an appropriate timing of error correction with respect to syndrome decode/error correction circuit 72. Timing adjustment signal generator 8 issues a timing signal TC in a way synchronous with data read from normal data section 1a.

Figure 8:
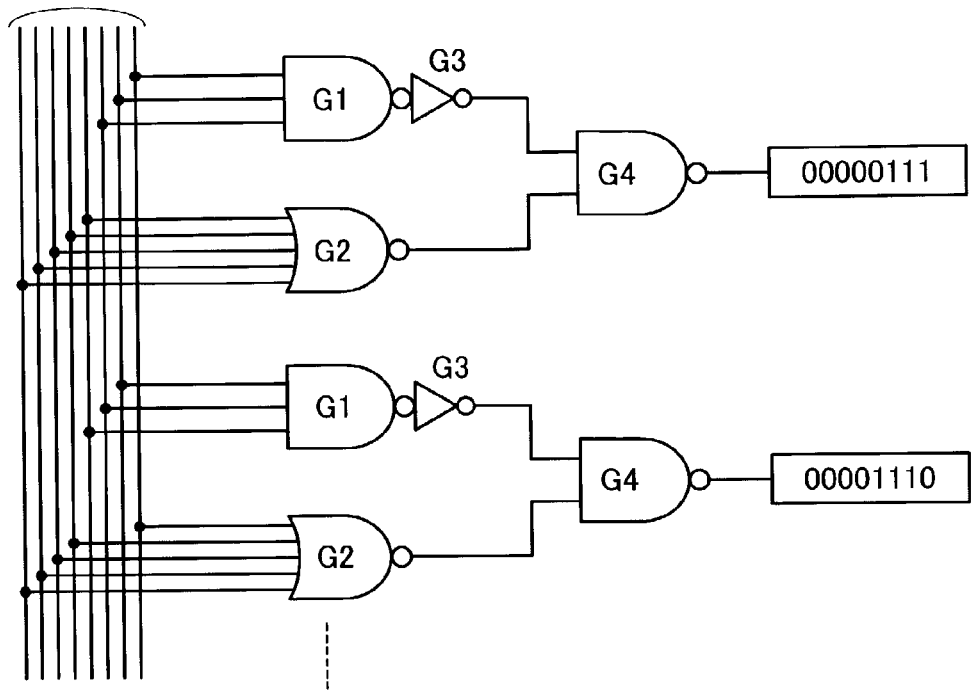
FIGS. 8–9 are diagram each showing another possible configuration of the syndrome signal decode circuit.

An exemplary configuration of the timing adjustment signal generator circuit 8 is shown in FIG. 8 in relation to the DQ buffer 5. In DQ buffer 5 a write circuit 51 is provided. Write circuit 51 is connected to data lines DQ, DQ(Bar) or "/DQ" coupled to a cell array 1, for converting write data WD into a complementary signal and supplying the same. Also provided in DQ buffer 5 is a buffer amplifier 52 for amplification of read data. Buffer amp 52 may be a differential amplifier of the current mirror type or else. This buffer amp 52 derives an output used to drive an N-channel metal oxide semiconductor (NMOS) transistor QN1, which has its drain connected to a read data line RD.

Figure 5:
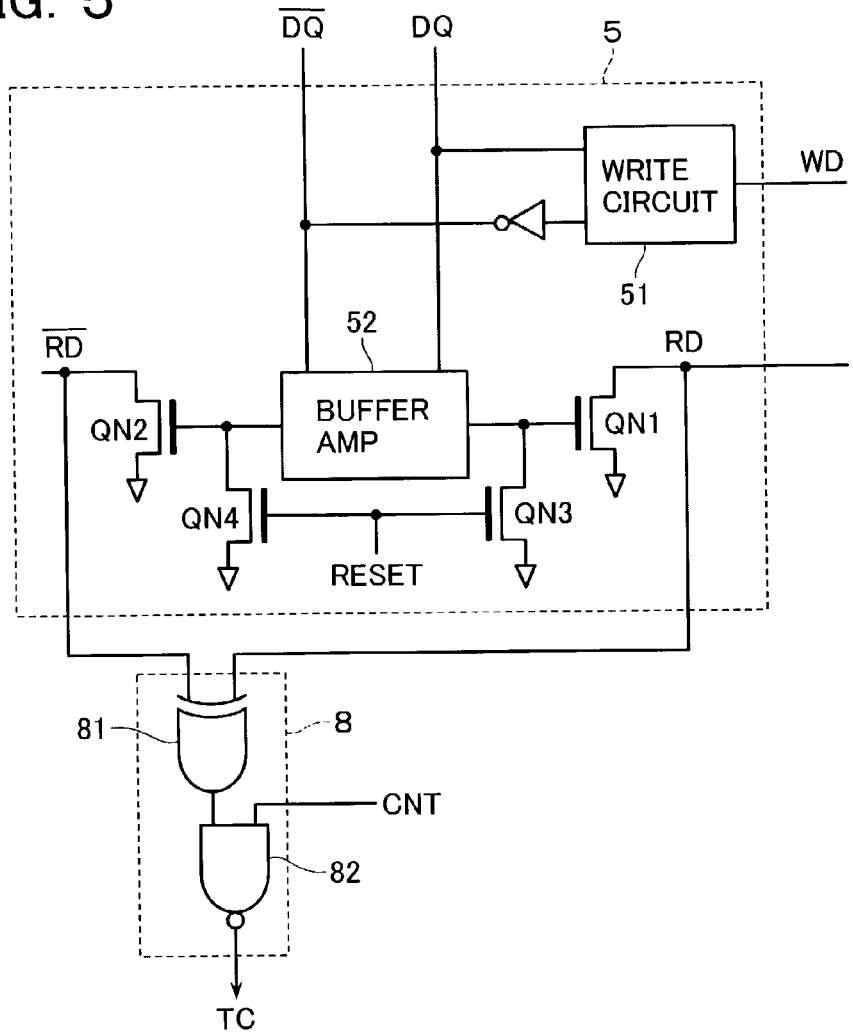
FIG. 5 is a diagram showing a configuration of a correction timing signal generation circuit of the same embodiment.

Although read data from the DQ buffer 5 is not a complementary signal in ordinary cases, the circuit configuration of FIG. 5 is such that the buffer amp 52 formed of a current-mirror type differential amplifier is designed as an amp of the differential output type. And an NMOS transistor QN2 is added, which is driven complementarily relative to the output-stage NMOS transistor QN1 as driven by buffer amp 52. NMOS transistor QN2 has a drain to which a read data line /RD is connected. And an Exclusive OR (Ex-OR) logic gate 81 is provided in timing adjustment signal generator 8, which gate has its input nodes coupled to these complementary data lines RD and /RD, respectively. This Ex-OR gate 81 derives an output, which is input to a NAND gate 82 along with a control signal CNT. Whereby, the intended correction timing signal TC is obtainable from NAND gate 82, which signal has a "Low" or "L" level only when the control signal CNT is at "High" ("H") level and when data is being read.

Figure 6A:
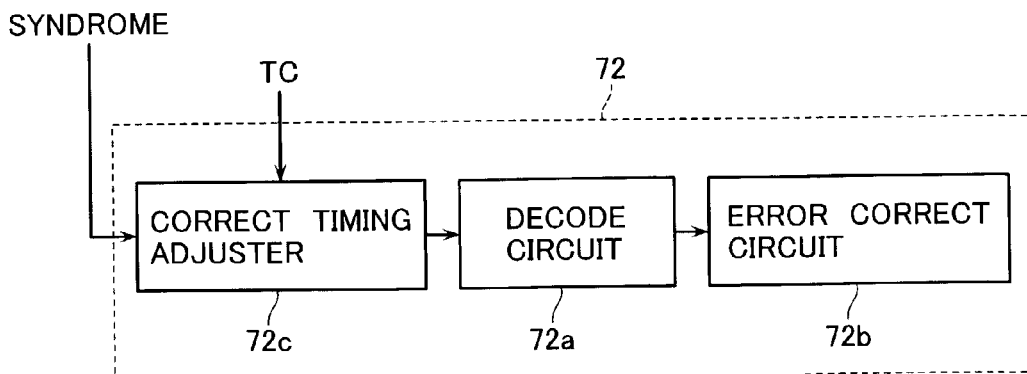
FIGS. 6A and 6B are diagrams each showing a configuration of an ECC circuit in the embodiment.

An exemplary scheme for control of the syndrome decode/error correction circuit 72 in response to the timing signal TC is as follows. As shown in FIG. 6A, syndrome decode/error correction circuit 72 has a syndrome decode circuit 72a and an error correction circuit 72b. At a pre-stage of syndrome decode circuit 72a, a correction timing adjustment circuit (transfer switch circuit) 72c is provided for controlling transfer of a syndrome signal—this is an output signal of syndrome generator circuit 75—toward decode circuit 72a in responding to receipt of the timing signal TC. Alternatively as shown in FIG. 6B, a correction timing adjustment circuit 72c is provided between decode circuit 72a and error correction circuit 72b for activating the transfer of a decoded signal in response to receipt of timing signal TC.

Performing control for activation of the syndrome decode/error correction circuit 72 only when data read is done in this way makes it possible to avoid any possible erroneous operation or malfunction of syndrome decode/error correction circuit 72 otherwise occurring due to application of noises thereto.

Figure 10:
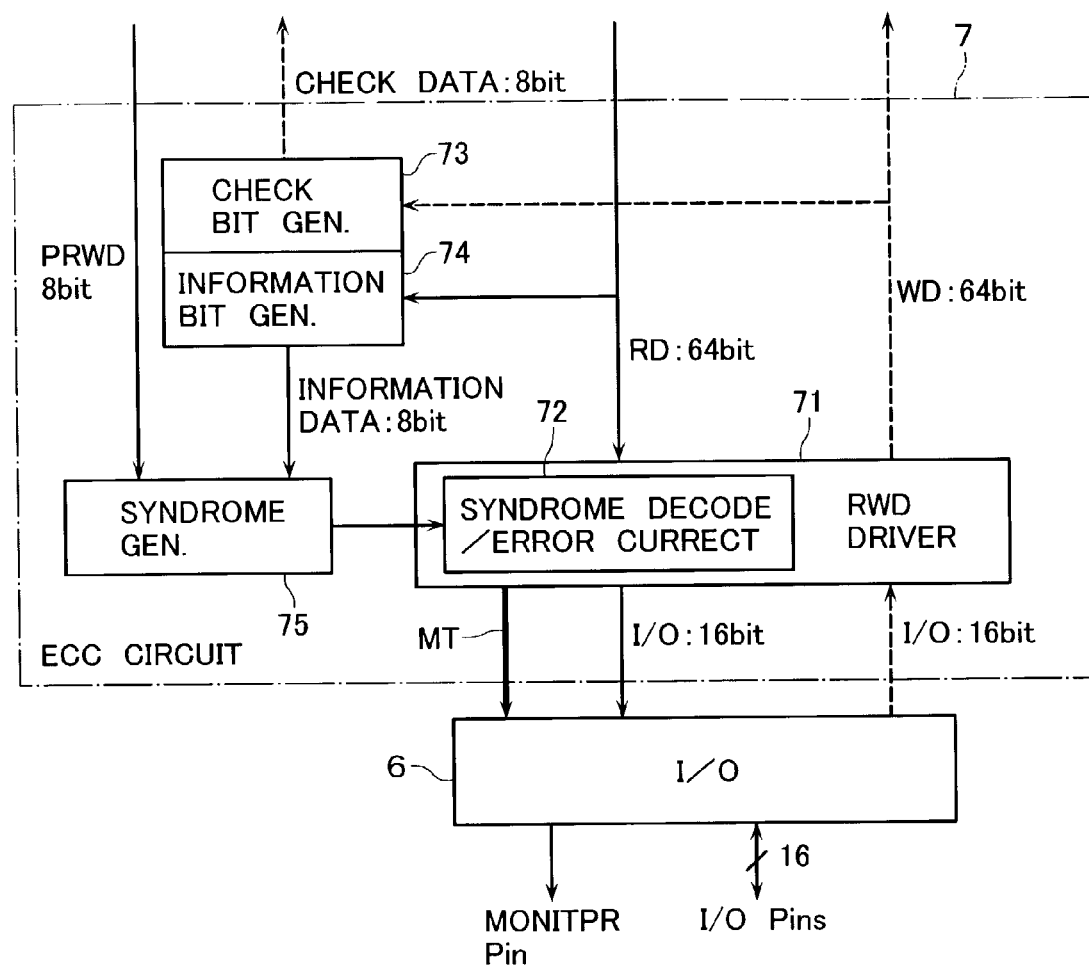
FIG. 10 is a diagram showing a configuration of ECC circuit of a semiconductor memory in accordance with a further embodiment of the invention.

An ECC circuit also embodying the invention is shown in FIG. 10. This circuit is similar in principle to the ECC circuit 7 of FIG. 3, with the read/write driver 71 being modified to output a correction monitor signal MT toward an external monitor terminal, which signal is indicative of occurrence of error detection/correction at the syndrome decode/error correction circuit 72. With such an arrangement, it is possible to confirm an operation of ECC circuit 7. The correction monitor signal MT may be of 1 bit as long as it is used for notification of only whether correction is present or not. Optionally it is also effective to modify syndrome decode/error correction circuit 72 so that it outputs a multiple-bit correction monitor signal MT to thereby enable confirmation of one or more correction locations.

Figure 6B:
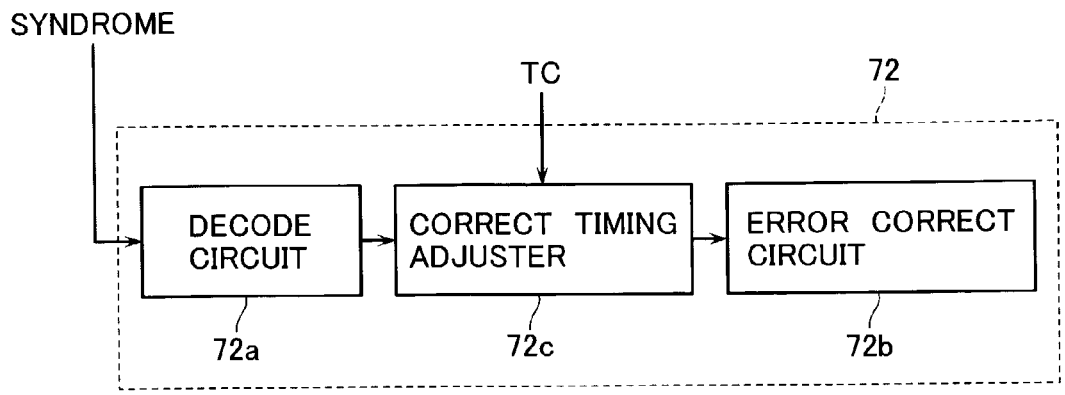
Figure 11A:
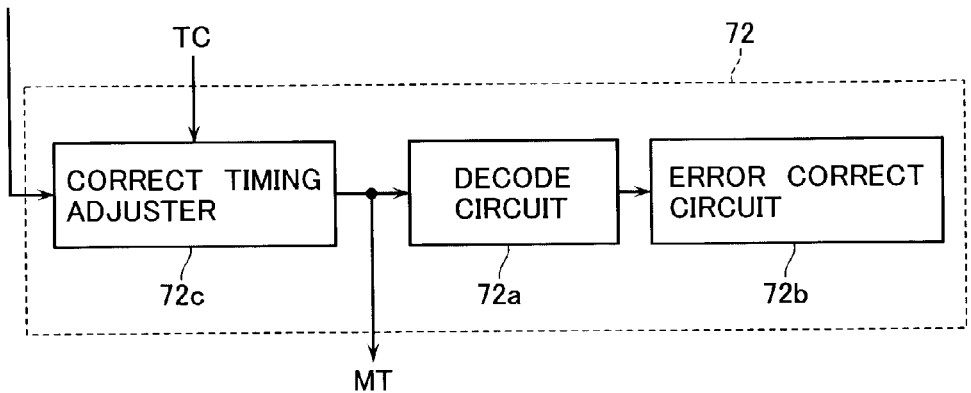
FIGS. 11A–11B are diagrams each showing a configuration of a correction monitor signal generation circuit in the embodiment.
Figure 11B:
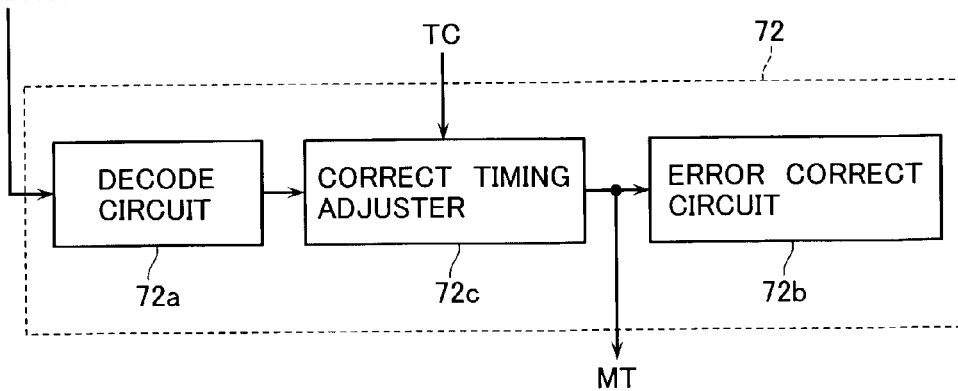

Examples of such circuitry for generating the error correction monitor signal MT are shown in FIGS. 11A and 11B in a way corresponding to the circuits of FIGS. 6A–6B respectively, wherein an output of the correction timing adjuster circuit 72c is used as the monitor signal MT.

It must be noted that in a respective one of the above-stated embodiments, the ECC circuit 7 is preferably designed to offer turn-on/off switchability in order to achieve successful functionality check procedures of the ECC circuit. This is attainable by arranging the control signal CNT of the output-stage NAND gate 82 in timing adjustment signal generator circuit 8 to turn on and off from peripheral circuitry externally associated with the memory chip. The functionality check of the ECC circuit may be done as follows: In a on-state of the ECC circuit 7, write a test data through the write operation as has been discussed in the previous embodiment(s). Then, let ECC circuit 7 turn off, causing previously written test data to be rewritten with certain data different at one bit. This results in forcible creation of an error state since the parity data section has not yet been updated. Thereafter, let ECC circuit 7 turn on again, thereby performing a test data read operation. With this procedure, it is possible to check or verify whether ECC circuit 7 operates properly.

Additionally, DRAM cell arrays inherently call for execution of refresh operations with a certain time period or interval. To do this, DRAM chips are equipped with built-in refresh circuitry for automatically performing refresh operations by way of example—in this case, no data will be read into the DQ buffer 5 during refresh operations. Thus, in the embodiment of FIG. 4, the timing adjustment signal generator circuit 8 is kept inoperative in refresh cycles, resulting in halt or "pause" of the operation of ECC circuit 7. This in turn makes it possible to suppress or minimize waste power consumption.

It has been stated that the semiconductor memory device incorporating the principles of this invention is such that the use of built-in ECC circuitry enables recovery or "rescue" of data defects, in particular those occurring due to the quest for further reduction of power consumption.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A semiconductor memory device comprising:
   a cell array including a normal data section used for normal data write and read and a parity data section used for check data write and read, the check data being for execution of error check of data as read out of said normal data section;
   a data buffer for temporal stage of read data from said cell array and write data into the cell array; and
   an error checking and correcting circuit for generating the check data to be stored in said parity data section from write data as input during data writing, and for performing error check and correction of data read out of said normal section based on the data read out of said normal data section and the check data read out of said parity data section during data reading, wherein
   n-bit parallel data transfer is performed between said data buffer and said normal data section of said cell array, whereas m-bit parallel data transfer is done between said data buffer and external input/output terminals (where m and n are integers satisfying m<n),
   n-bit data including m-bit data to be rewritten is read in parallel in a first half period of a data write cycle while letting error check and correction of the n-bit data be done at said error checking and correcting circuit, and
   a to-be-written m-bit data portion of the n-bit parallel data as has been corrected at said error checking and correcting circuit is replaced with m-bit parallel data as supplied from the external input/output terminals in a second half period of the data write cycle and then sent forth to said normal data section.

2. The semiconductor memory device according to claim 1, wherein said error checking and correcting circuit is one that performs single-bit error correction using a Hamming code, and wherein the check data being stored in said parity data section is of a minimal number of bits required for read data error check and correction.

3. The semiconductor memory device according to claim 1, wherein said error checking and correcting circuit is one that performs single-bit error correction using a Hamming code, and wherein the check data as stored in said parity data section is of a specific number of bits, said number being greater by one (1) than a minimal bit number required for read data error check and correction.

4. The semiconductor memory device according to claim 1, wherein said error checking and correcting circuit prevents execution of error correction when an error bit is found at said to-be-written m-bit data portion and performs error correction when an error bit is found at a portion other than said to-be-written m-bit data portion.

5. The semiconductor memory device according to claim 1, wherein said error checking and correcting circuit prevents execution of correction of corresponding cell data of said normal data section in a data read cycle even when read data error correction occurs.

6. The semiconductor memory device according to claim 1, wherein said cell array is a dynamic random access memory ("DRAM") cell array with data being refreshed with a prespecified period, and wherein said error checking and correcting circuit is rendered inoperative during a refresh operation of said DRAM cell array.

7. A semiconductor memory device comprising:
   a cell array including a normal data section used for normal data write and read and a parity data section used for check data write and read, the check data being for execution of error check of data as read out of said normal data section;

a data buffer for temporal stage of read data from said cell array and write data into the cell array;

an error checking and correcting circuit for generating check data to be stored in said parity data section from write data as input thereto during data writing, and for performing error check and correction of data read out of said normal data section based on the data read out of said normal data section and the check data as read out of said parity data section during data reading;

said error checking and correcting circuit having a syndrome generation circuit for generation of a syndrome signal based on the read data and the check data, and a syndrome decode/error correction circuit for performing error bit correction through decoding of the syndrome signal thus generated;

timing signal generation circuit for detecting an output data change at said data buffer and for generating a timing signal; and correction timing adjustment circuit controllable by the timing signal as generated at said timing signal generation circuit for transferring said syndrome signal toward said syndrome decode/error correction circuit;

wherein n-bit parallel data is sent and received between said data buffer and said normal data section of said cell array whereas in-bit parallel data is sent and received between said data buffer and external input/output terminals (where m<n), n-bit data including m-bit data to be rewritten is read in parallel in a first half period of a data write cycle while letting error check and correction of the n-bit data be done at said error checking and correcting circuit, and a to-be-written m-bit data portion of the n-bit parallel data as has been corrected at said error checking and correcting circuit is replaced by m-bit parallel data as supplied from the external input/output terminals in a second half period of the data write cycle and then sent forth to said normal data section.

8. The semiconductor memory device according to claim 7, wherein said error checking and correcting circuit is one that performs single-bit error correction using a Hamming code and wherein the check data to be stored at said parity data section is of a minimal number of bits as required for read data error check and correction.

9. The semiconductor memory device according to claim 7, wherein said error checking and correcting circuit is one that performs single-bit error correction using a Hamming code and wherein the check data being stored at said parity data section is of a specified number of bits, said number being greater by one (1) than a minimal bit number as required for read data error check and correction.

10. The semiconductor memory device according to claim 7, wherein said error checking and correcting circuit prevents execution of error correction when an error bit is found at said to-be-written m-bit data portion, and performs error correction when an error bit is found at a portion other than said to-be-written m-bit data portion.

11. The semiconductor memory device according to claim 7, wherein said error checking and correcting circuit prevents execution of correction of corresponding cell data of said normal data section in a data read cycle even when read data error correction occurs.

12. The semiconductor memory device according to claim 7, wherein said cell array is a DRAM cell array with data being refreshed with a prespecified period, and wherein said error checking and correcting circuit is rendered inoperative during a refresh operation of said DRAM cell array.

13. The semiconductor memory device according to claim 7, wherein said error checking and correcting circuit is arranged to be switchable between active and inactive states through external control of an active state and an inactive state of said timing signal generation circuit.

14. The semiconductor memory device according to claim 7, further comprising:

a monitor terminal for outputting an output of said correction timing adjustment circuit as a monitor signal for externally notifying whether error correction is present or not.

15. A semiconductor memory device comprising:

a cell array including a normal data section used for normal data write and read and a parity data section used for check data write and read, the check data being for execution of error check of data as read out of said normal data section;

a data buffer for temporal stage of read data from said cell array and write data into the cell array;

an error checking and correcting circuit for generating check data to be stored in said parity data section from write data as input thereto during data writing, and for performing error check and correction of data being read based on the data read out of said normal data section and the check data as read out of said parity data section during data reading, wherein said error checking and correcting circuit includes a syndrome decode/error correction circuit having therein a syndrome generation circuit for generation of a syndrome signal based on the read data and check data, and a syndrome decode circuit for decoding the syndrome signal thus generated to thereby perform error bit correction, and said syndrome decode circuit comprises a first NAND gate for detection of a "1" data combination of the syndrome signal, a NOR gate for detection of a "0" data combination, and a second NAND gate for performing coincidence detection of an inverted signal of an output of said first NAND gate and an output of said NOR gate;

wherein n-bit parallel data is sent and received between said data buffer and said normal data section of said cell array whereas in-bit parallel data is sent and received between said data buffer and external input/output terminals (where m<n), n-bit data including in-bit data to be rewritten is read in parallel in a first half period of a data write cycle while letting error check and correction of the n-bit data be done at said error checking and correcting circuit, and a to-be-written in-bit data portion of the n-bit parallel data as has been corrected at said error checking and correcting circuit is replaced by m-bit parallel data as supplied from the external input/output terminals in a second half period of the data write cycle and then sent forth to said normal data section.

16. The semiconductor memory device according to claim 15, wherein said error checking and correcting circuit is one that performs single-bit error correction using a Hamming code, and wherein the check data being stored in said parity data section is of a minimal number of bits required for read data error check and correction.

17. The semiconductor memory device according to claim 15, wherein said error checking and correcting circuit is one that performs single-bit error correction using a Hamming code, and wherein the check data as stored in said parity data section is of a specific number of bits, said number being greater by one (1) than a minimal bit number required for read data error check and correction.

18. The semiconductor memory device according to claim 15, wherein said error checking and correcting circuit prevents execution of error correction when an error bit is found at said to-be-written m-bit data portion and performs error correction when an error bit is found at a portion other than said to-be-written m-bit data portion.

19. The semiconductor memory device according to claim 15, wherein said error checking and correcting circuit prevents execution of correction of corresponding cell data of said normal data section in a data read cycle even upon occurrence of read data error correction.

20. The semiconductor memory device according to claim 15, wherein said cell array is a DRAM cell array with data being refreshed with a prespecified period, and wherein said error checking and correcting circuit is rendered inoperative during a refresh operation of said DRAM cell array.

21. A semiconductor memory device comprising:
a cell array including a normal data section used for normal data write and read and a parity data section used for check data write and read, the check data being for execution of error check of data as read out of said normal data section;
a data buffer for temporal stage of read data from said cell array and write data into the cell array; and
an error checking and correcting circuit for generating check data to be stored in said parity data section from write data as input thereto during data writing, and for performing error check and correction of data being read based on the data read out of said normal data section and the check data as read out of said parity data section during data reading, wherein
said error checking and correcting circuit includes a syndrome decode/error correction circuit having therein a syndrome generation circuit for generation of a syndrome signal based on the read data and check data, and a syndrome decode circuit for decoding the syndrome signal thus generated to thereby perform error bit correction, and
said syndrome decode circuit comprises an array of NAND gates for detection of a "1" data combination of the syndrome signal;
wherein n-bit parallel data is sent and received between said data buffer and said normal data section of said cell array whereas m-bit parallel data is sent and received between said data buffer and external input/output terminals (where m<n),
n-bit data including m-bit data to be rewritten is read in parallel in a first half period of a data write cycle while letting error check and correction of the n-bit data be done at said error checking and correcting circuit, and
a to-be-written in-bit data portion of the n-bit parallel data as has been corrected at said error checking and correcting circuit is replaced by m-bit parallel data as supplied from the external input/output terminals in a second half period of the data write cycle and then sent forth to said normal data section.

22. The semiconductor memory device according to claim 21, wherein said error checking and correcting circuit is one that performs single-bit error correction using a Hamming code, and wherein the check data being stored in said parity data section is of a minimal number of bits required for read data error check and correction.

23. The semiconductor memory device according to claim 21, wherein said error checking and correction circuitry is one that performs single-bit error correction using a Hamming code, and wherein the check data as stored in said parity data section is of a specific number of bits, said number being greater by one (1) than a minimal bit number required for read data error check and correction.

24. The semiconductor memory device according to claim 21, wherein said error checking and correcting circuit prevents execution of error correction when an error bit is found at said to-be-written m-bit data portion and performs error correction when an error bit is found at a portion other than said to-be-written m-bit data portion.

25. The semiconductor memory device according to claim 21, wherein said error checking and correcting circuit prevents execution of correction of corresponding cell data of said normal data section in a data read cycle even upon occurrence of read data error correction.

26. The semiconductor memory device according to claim 21, wherein said cell array is a DRAM cell array with data being refreshed with a prespecified period, and wherein said error checking and correcting circuit is rendered inoperative during a refresh operation of said DRAM cell array.

27. A semiconductor memory device comprising:
a cell array including a normal data section used for normal data write and read and parity data section used for check data write and read, the check data being for execution of error check of data as read out of said normal data section;
a data buffer for temporal stage of read data from said cell array and write data into the cell array; and
an error checking and correcting circuit for generating check data to be stored in said parity data section from write data as input thereto during data writing, and for performing error check and correction of data being read based on the data read out of said normal data section and the check data as read out of said parity data section during data reading, wherein
said error checking and correcting circuit is one that performs single-bit error correction using a Hamming code and wherein the check data being stored at said parity data section is of a specified number of bits, said number being greater by one (1) than a minimal bit number as required for read data error check and correction;
wherein n-bit parallel data is sent and received between said data buffer and said normal data section of said cell array whereas m-bit parallel data is sent and received between said data buffer and external input/output terminals (where m<n),
n-bit data including m-bit data to be rewritten is read in parallel in a first half period of a data write cycle while letting error check and correction of the n-bit data be done at said error checking and correcting circuit, and
a to-be-written m-bit data portion of the n-bit parallel data as has been corrected at said error checking and correcting circuit is replaced by m-bit parallel data as supplied from the external input/output terminals in a second half period of the data write cycle and then sent forth to said normal data section.

28. The semiconductor memory device according to claim 27, wherein said error checking and correcting circuit prevents execution of error correction when an error bit is found at said to-be-written m-bit data portion and performs error correction when an error bit is found at a portion other than said to-be-written m-bit data portion.

29. The semiconductor memory device according to claim 27, wherein said error checking and correcting circuit prevents execution of correction of corresponding cell data of said normal data section in a data read cycle even when read data error correction occurs.

30. The semiconductor memory device according to claim 27, wherein said cell array is a DRAM cell array with data being refreshed with a prespecified period, and wherein said error checking and correcting circuit is rendered inoperative during a refresh operation of said DRAM cell array.

* * * * *